(12) United States Patent
Mehta et al.

(10) Patent No.: US 9,077,314 B2
(45) Date of Patent: Jul. 7, 2015

(54) FEEDBACK-BASED PARTICLE FILTERING

(71) Applicant: The Board of Trustees of the University of Illinois, Urbana, IL (US)

(72) Inventors: Prashant G. Mehta, Urbana, IL (US); Tao Yang, Urbana, IL (US); Sean P. Meyn, Gainsville, FL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 334 days.

(21) Appl. No.: 13/670,596

(22) Filed: Nov. 7, 2012

(65) Prior Publication Data

US 2013/0132454 A1    May 23, 2013

Related U.S. Application Data

(60) Provisional application No. 61/562,091, filed on Nov. 21, 2011.

(51) Int. Cl.
    *G06F 17/10*      (2006.01)
    *H03H 17/02*      (2006.01)

(52) U.S. Cl.
    CPC ................ *H03H 17/0261* (2013.01)

(58) Field of Classification Search
    CPC .......... H03H 17/0263; H03H 17/0261; H03H 17/06; G06T 5/20; H04Q 11/00
    USPC ....................................................... 708/304
See application file for complete search history.

(56) References Cited

U.S. PATENT DOCUMENTS

2005/0038638 A1*   2/2005   Comaniciu et al. ............... 703/2
2013/0332064 A1*   12/2013   Funk et al. .................... 701/409

OTHER PUBLICATIONS

Budhiraja et al., "A Survey of Numerical Methods for Nonlinear Filtering Problems," *Physica D: Nonlinear Phenomena*, vol. 230, Nos. 1-2, 17 pages (Jun. 2007).
Crisan et al., "Approximate McKean-Vlasov Representations for a class of SPDEs," *Stochastics: An International Journal of Probability and Stochastic Processes*, vol. 82, No. 1, 20 pages (2010).
Tilton et al., "Filtering with Rhythms: Application to Estimation of Gait Cycle," *2012 Am. Control Conf.*, Montréal, Canada, pp. 3433-3438 (Jun. 27-29, 2012).

(Continued)

*Primary Examiner* — Tan V. Mai
(74) *Attorney, Agent, or Firm* — Sunstein Kann Murphy & Timbers LLP

(57) ABSTRACT

Methods for estimating a conditional probability distribution for signal states of a non-linear random dynamic process. The filter is based on multiple particles, each defined by a state space model similar to the dynamic process. Each particle is updated on the basis of a control input derived by proportional gain feedback on an innovation process. The innovation process is the difference between an increment in an observed quantity measured by one or more sensors and an average of a function of the particles. The particle filter of the invention may also be applied to filtering problems with data association uncertainty where multiple measurements are obtained, of which at most one originates from a specified target.

14 Claims, 2 Drawing Sheets

(56) References Cited

OTHER PUBLICATIONS

Tilton et al., "Feedback Particle Filter-based Multiple Target Tracking using Bearing-only Measurements," *2012 15th International Conference on Information Fusion*, Singapore, 7 pages. (Jul. 9-12, 2012).

Yang et al., "A Mean-field Control-oriented Approach to Particle Filtering," *2011 Am. Control Conf.*, San Francisco, CA, pp. 2037-2043 (Jun. 29-Jul. 1, 2011).

Yang et al., "Feedback Particle Filter with Mean-field Coupling," *2011 50th IEEE Conference on Decision and Control and European Control Conf. (CDC-ECC)*, Orlando, FL, pp. 7909-7916 (Dec. 12-15, 2011).

Yang et al., "Joint Probabilistic Data Association—Feedback Particle Filter for Multiple Target Tracking Applications," *Am. Control Conf.*, Montreal Canada, pp. 820-826 (Jun. 27-29, 2012).

\* cited by examiner

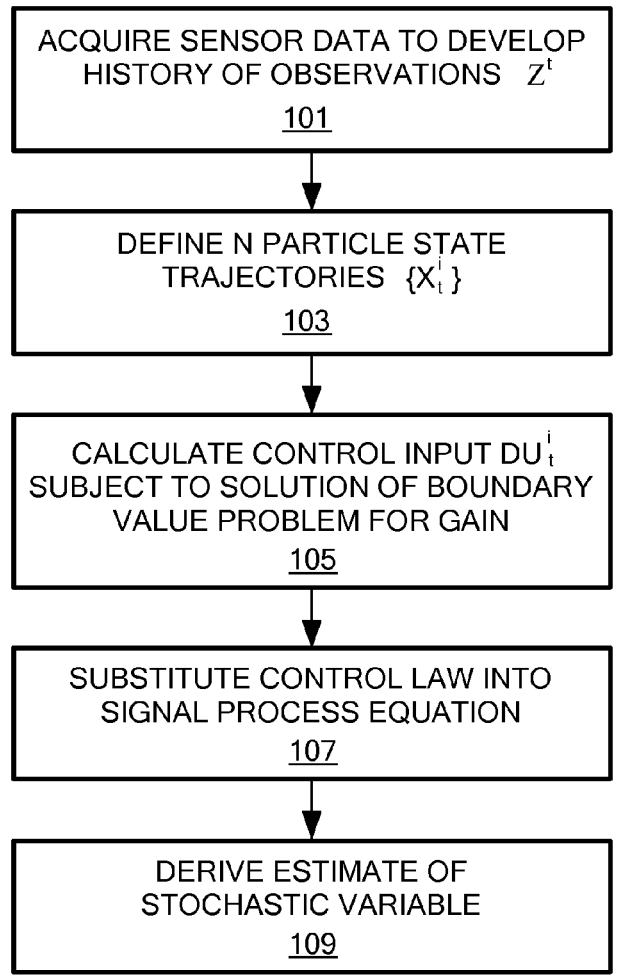
*FIG. 1*
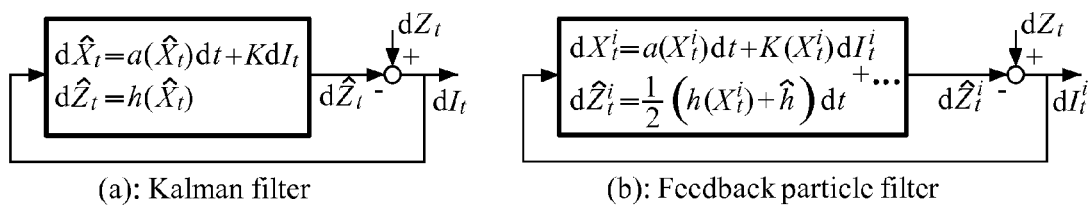
*FIG. 2A*  *FIG. 2B*

FEEDBACK-BASED PARTICLE FILTERING

This application claims the priority of U.S. Provisional Patent Application Ser. No. 61/562,091, filed Nov. 21, 2011, which is incorporated herein by reference.

This invention was made with government support under Grant Nos. ECCE 09-25534 and CCF-08-30776, awarded by the National Science Foundation, and under Grant No. 239 AF FA9550-09-0190, awarded by the Air Force Office of Scientific Research. The Government has certain rights in the invention.

TECHNICAL FIELD OF THE INVENTION

The present invention pertains to computer-implemented methods for approximating a solution of nonlinear filtering problems, and, more particularly, to "particle filters" with a feedback control structure. {As used herein, and in any appended claims, the term "particle" is used in its technical mathematical sense, as rigorously defined below, referring to a sample drawn from a probability distribution that represents the uncertainty of a random process.}

BACKGROUND OF THE INVENTION

When sensors measure data pertaining to a hidden stochastic (or, random) process in the physical world, such measurements are typically corrupted by noise and/or by uncertainty in the initial conditions. In order to usefully discern trends in the data and to make useful predictions with respect to future evolution of the process, it is necessary to estimate a "best guess" as to the true value of one or more random variables at one or more times during the course of the evolution of the process. (A more formal statement of the objective of filtering is provided below.) Much signal processing involves random processes, particularly, problems in remote sensing, air traffic surveillance, autonomous navigation, robotics and other control technologies, weather surveillance, and many others. The estimation of an entire posterior distribution of a random process (i.e., the distribution of the random variable conditional on the measurements performed) is referred to as the filtering problem.

In some cases, such as where noise is known to obey Gaussian distributions and where the systems are causal and time invariant, well-known solutions to the filtering problem may be applied. When an output variable may be characterized as a linear function of the hidden stochastic process, linear filtering techniques such as the Wiener filter or Kalman filter are applicable. In the nonlinear domain, filtering algorithms are analytically intractable and require some recursive process that may only be performed on a computer and require some form of approximation in order to be calculated in anywhere near real time.

In mathematical terms, the filtering problem can be stated in terms of the following stochastic differential equations (SDEs):

$$dX_t = a(X_t)dt + \sigma_B dB_t, \quad (1a)$$

$$dZ_t^m = h^m(X_t)dt + \sigma_W^m dW_t^m, \quad (1b)$$

where $X_t$ is the state at time t, represented by a vector of real values, and $Z_t^m$ is a (real) scalar-valued observation process for $m=1, \ldots, M$, $a(\cdot)$, $h^m(\cdot)$ are $C^1$ (continuously differentiable) functions, and $\{B_t\}$, $\{W_t^m\}_{m=1}^M$ are mutually independent standard Wiener processes. By definition, $Z_t := (Z_t^1, Z_t^2 \ldots Z_t^M)$.

Eqn. 1a may be referred to as the "signal process equation," while Eqn. 1b is "the observation process equation." The notation employed in Eqns. 1a and 1b is that of stochastic differential equations interpreted in the Itōsense. Formally, "$dX_t = X(t+dt) - X(t)$," and $dB_t \sim N(0, dt)$ is an independent Gaussian increment with 0 mean and variance dt. Alternatively, by denoting $$"Y := \frac{dZ}{dt},"$$

the observation equation may also be expressed as $Y_t = h(X_t) + \sigma_W \dot{W}_t$, where $h(X_t) = (h^1(X_t), h^2(X_t), \ldots, h^M(X_t))$, and $\dot{W}_t$ is the white noise process.

The objective of the filtering problem is to estimate the posterior distribution p* of $X_t$ given the history $\mathcal{Z}^t := \sigma(Z_s : s \leq t)$. If $a(\cdot)$, $h(\cdot)$ are linear functions, the solution is given by the finite-dimensional Kalman filter. In the general case, however, $a(\cdot)$, $h(\cdot)$ are not limited to being linear functions. The theory of nonlinear filtering is described in the classic monograph Kallianapur et al., *Stochastic filtering theory*, vol. 13 of (1980), which is incorporated herein by reference. In the general case, the filter is infinite dimensional since it defines the evolution, in the space of probability measures, of $\{p^*(\cdot, t) : t \geq 0\}$, and, for that reason alone, is not susceptible to analytical solution.

Various techniques known in the art for approximating non-linear filters are surveyed, for example, by Budhiraja et al., A survey of numerical methods for nonlinear filtering problems, *Physica D*, 230, pp. 27-36 (2007), incorporated herein by reference. The particle filter is a simulation-based approach to approximate the filtering task, whereby N stochastic processes $\{X_t^i : 1 \leq i \leq N\}$ are constructed. (The $X_t^i$'s assume "real" values, in the mathematical sense.)

DEFINITION: Each of the N stochastic processes used in a simulation implementing a filter is called a "particle." The value $X_t^i$ is the state for the $i^{th}$ particle at time t.

For each time t, the empirical distribution (denoted p) formed by the "particle population" is used to approximate the posterior distribution. In sequential importance sampling, particles are generated according to their importance weight at every time step. Various approaches employ resampling or bootstrapping. Deficiencies of known techniques include high variance, which can be especially severe in cases where numerical instabilities arise. Sampling, additionally, imposes especially large computational and memory requirements. Thus, for the practical applications listed above, and for others, a more robust and efficient means for nonlinear filtering that avoids both resampling and bootstrapping is highly desirable.

SUMMARY OF CERTAIN EMBODIMENTS OF THE INVENTION

In accordance with preferred embodiments of the present invention, a method is provided for estimating a conditional probability distribution for signal states of a non-linear random dynamic process. The method has steps of:

a. receiving sensor measurement data associated with the non-linear random dynamic process, the sensor measurement data providing a history of observations;

b. initializing a state for each of a plurality of particles, the plurality of particles together comprising an entire population of particles, the states of the plurality of particles collectively probabilistically representing an estimate of a state of the non-linear random dynamic process at an initial time; and c. updating the state for each of the plurality of particles to obtain a posterior distribution based on a control input derived by proportional gain feedback on an innovation process, wherein the innovation process is the difference between an observed quantity based on sensor data at time t and a quantity in which a function of a particle state is a term.

In accordance with certain embodiments of the invention, the method further comprises acquiring the sensor measurement data from at least one sensor, which may be a remote sensor or a camera.

In other embodiments, the control input may be a solution to an optimization problem.

In accordance with yet other embodiments of the invention, the step of updating may include application of proportional feedback based on a gain function, where the gain function may be derived by numerical solution of a boundary value problem, such as an Euler-Lagrange boundary value problem. Alternatively, the gain function may be obtained by analytical approximation.

In accordance with alternate embodiments of the invention, the innovation process may comprise, in particular, at least a term proportional to an average of predictions due to the entire population of particles.

The sensor measurement data may correspond to positions of one or more moving objects relative to a fixed frame of reference, where the moving objects may be ballistic objects. The moving objects need not be ballistic objects, however. Moreover, the moving objects may be weather cells, for example.

In accordance with yet further embodiments of the invention, a computer program product may be provided for use on a computer system for estimating a conditional probability distribution for signal states of a non-linear random dynamic process. The computer program product has a computer readable tangible and non-transitory medium having computer readable program code fixed thereon. The computer readable program code has:

a. program code for inputting sensor measurement data from one or more sensors associated with the non-linear random dynamic process, the sensor measurement data providing a history of observations;

b. program code for initializing state data for a plurality of particles, together comprising an entire population of particles, the state data collectively probabilistically representing an estimate of a state of the non-linear random dynamic process at an initial time; and c. program code for updating the model state for each of the plurality of particles to obtain a posterior distribution based on a control input derived by operation of an operator on an innovation process, wherein the innovation process is the difference between an observed quantity at a time t and a quantity in which a function of a particle state is a term.

DESCRIPTION OF THE FIGURES

The foregoing features of the invention will be more readily understood by reference to the following detailed description, taken with reference to the accompanying drawings, in which:

FIG. 1 is a flowchart depicting the steps involved in the process of solving the nonlinear filtering problem to estimate a conditional probability distribution for signal states of a non-linear random process in accordance with an embodiment of the present invention.

FIG. 2 compares an innovation error-based feedback structure for the prior art Kalman filter (shown in FIG. 2A, and for the feedback particle filter (FIG. 2B), in accordance with an embodiment of the present invention.

DESCRIPTION OF SPECIFIC EMBODIMENTS OF THE INVENTION

Figure 3:
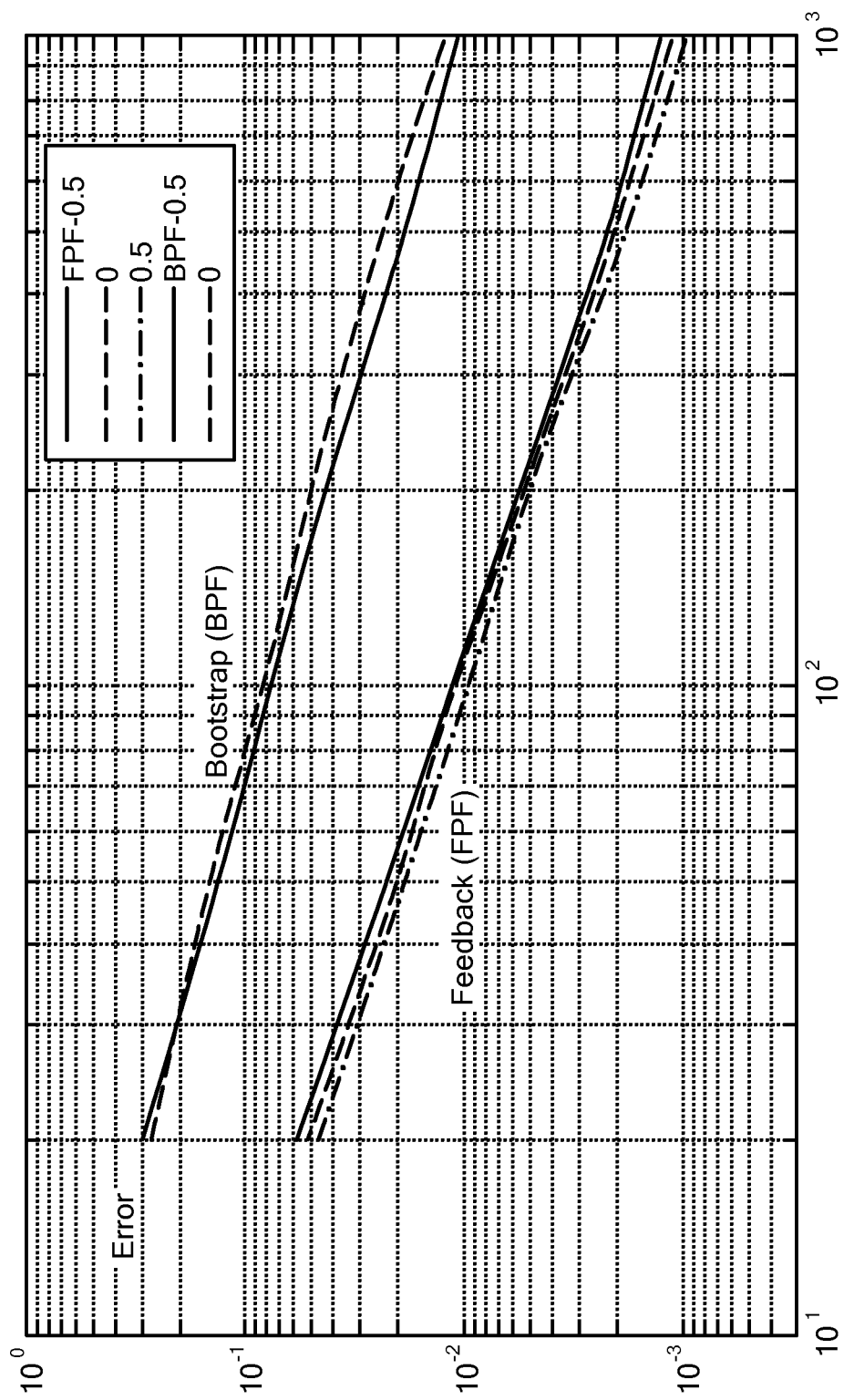
FIG. 3 compares results of a feedback particle filter, in accordance with an embodiment of the present invention, with results of a prior art bootstrap particle filter.

In accordance with embodiments of the present invention, methods are taught for estimating a conditional probability distribution for signal states of a non-linear random dynamic process. Measurements are performed by sensors yielding data at each step of time, where the data are real scalar values, and where the observed increment, at the time referred to by t, is represented as $dZ_t^m$. In order to solve the nonlinear filtering problem discussed above, in the Background of the Invention section, a feedback particle filter is introduced, as will now be described.

Further detail with respect to the methods described herein may be found with reference to the following five papers, all of which are attached hereto, and all of which are incorporated herein by reference:

Yang et al., *A mean field control-oriented algorithm for particle filtering*, in *Proc. Am. Control Conf.*, pp. 2037-43, (June, 2011); hereinafter "Yang et al. (ACC, 2011)";

Yang et al., *Feedback particle filter based on mean-field coupling*, IEEE Conf. Decision and Control, Orlando, Fla., pp. 7909-16, (December, 2011); hereinafter "Yang et al. (CDC, 2011)";

Yang et al., *Joint probabilistic data association feedback particle filter for multi-target application*, Am. Control Con., Montréal, Canada, pp. 820-26, (June, 2012); hereinafter "Yang et al. (ACC, 2012)";

Tilton et al., *Filtering with rhythms: Application of the feedback particle filter to estimation of human gait cycle*, Am. Control Conf., Montréal, Canada, pp. 3433-38, (June, 2012); hereinafter "Tilton et al. (ACC, 2012)"; and Tilton et al., *Feedback Particle Filter-based Multiple Target Tracking using Bearing-only Measurements*, Proc. 15th Int. Conf. on Inf. Fusion, Singapore, pp. 2058-64, (July, 2012).

In the approach now described with reference to embodiments of the present invention, and with particular reference to FIG. 1, sensors perform a time-series of measurements. Data acquired by the sensor (or sensors) are used to develop a history $\mathcal{Z}^t$ of observations (101). In some embodiments of the invention, a record of data that have already been accumulated are received by the system. A population of N particles is initialized (103), where the model for the $i^{th}$ particle is defined by a controlled system:

$$dX_t^i = a(X_t^i)dt + \sigma_B dB_t^i + \underbrace{dU_t^i}_{control}, \qquad (2)$$

where $X_t^i \in \mathbb{R}^d$ is the state for the $i^{th}$ particle at time t, $U_t^i$ is its control input, and $\{B_t^i\}_{i=1}^N$ are mutually independent standard Wiener processes. The initial conditions $\{X_0^i\}_{i=1}^N$ are independent and identically distributed (i.i.d., as commonly defined in mathematics), and are drawn from the prior distribution for $X_0$, i.e., they reflect only knowledge about the system before the sensors perform any measurements. The notation p(x, t) refers to the conditional distribution of a particle $X_t^i$ given $\mathcal{Z}^t$, which is to say, given the history of observations, using sensors such as cameras, radar, etc., that have already been made up until time t.

In accordance with the model employed in the embodiments of the invention currently being described, the control $dU_t^i$ can be expressed (105) as the result of an operation on an innovation process (or error) in the following sense:

$$dU_t^i := \sum_{m=1}^{M} K^m(X_t^i, t) dI_t^{i,m} + \frac{1}{2}(\sigma_W^m)^2 [\nabla K^m(X_t^i, t)] K^m(X_t^i, t) dt, \quad (3)$$

where: $dI_t^{i,m}$ represents the innovation process (error), as further discussed below, the gain function $K^m(x,t)$ is d×1 vector, $\nabla$ is the gradient operator so $\nabla K^m$ is a d×d matrix, and $(\nabla K^m) K^m$ denotes the matrix vector product.

In particular, Eqn. (3) reflects that the control $dU_t^i$ is expressed as the result of an operation on innovation process As in the case of Eqn. 2 above, the stochastic differential equation, Eqn. 3, is interpreted in the Itō sense. The second term in Eqn. 3 is the Wong-Zakai correction term that is needed in writing the Itō form of the filter SDE, Eqn. 3. This term is not present in the Stratonovich form of the filter SDE, as now discussed.

It is to be understood that the invention, as claimed herein, is not dependent upon the particular calculus of stochastic processes employed. Thus, any of the following equivalent filter forms, provided solely by way of example, may be used:

Equivalent Filter Forms
1. Itō form of the filter SDE:

$$dX_t^i = a(X_t^i)dt + \sigma_B dB_t^i + \sum_{m=1}^{M} K^m(X_t^i, t) dI_t^{i,m} + \frac{1}{2}(\sigma_W^m)^2 (\nabla K^m(X_t^i, t)) K^m(X_t^i, t) dt, \quad (4)$$

2. Stratonovich form of the filter SDE:

$$dX_t^i = a(X_t^i)dt + \sigma_B dB_t^i + \sum_{m=1}^{M} K^m(X_t^i, t) \circ dI_t^{i,m}. \quad (5)$$

3. ODE notation:

$$\frac{d}{dt} X_t^i = a(X_t^i) + \sigma_B \dot{B}_t^i + \sum_{m=1}^{M} K^m(X_t^i, t) \left( Y_t^m - \frac{h^m(X_t^i) + \frac{1}{N} \sum_{j=1}^{N} h^m(X_t^j)}{2} \right), \quad (6)$$

where $\dot{B}_t^i$ is a white noise process and $$Y_t^m := \frac{d}{dt} Z_t^m.$$

In past practice, the innovation process has been conventionally defined as a difference between the $dZ_t^m$ and the contemporaneous mean value $\hat{h}_t$. However, the innovation process (error) used in the control, in accordance with embodiments of the present invention, is, instead, a difference between the increment $dZ_t^m$ in a measurement of the observed quantity and an average (which may be weighted in different ways), of $h(X_t^i)$ and $\hat{h}_t$. In particular, in accordance with preferred embodiments of the present invention, the innovation process is, particularly, $$dI_t^{i,m} := dZ_t^m - \frac{1}{2}\left( h^m(X_t^i) + \frac{1}{N} \sum_{j=1}^{N} h^m(X_t^j) \right) dt, \quad (7)$$

or may be similar to it, in the sense of a more generalized weighting of $X_t^i$ relative to the population mean, $\hat{h}_t$. In all cases in accordance with the present invention, innovation process $dI_t^{i,m}$ is expressed as the difference between an increment $dZ_t^m$ in an observed quantity and a quantity (here, in parentheses) in which $h(X_t^i)$ (or some weighting thereof) is a term.

The vector-valued gain function $K^m(X, t)$ is given, in accordance with embodiments of the present invention, by the solution of the following boundary value problem:

$$\nabla \cdot (pK^m) = -\frac{1}{(\sigma_W^m)^2}\left( h^m - \frac{1}{N} \sum_{j=1}^{N} h^m(X_i^j) \right) p, \quad (8)$$

where $\nabla \cdot ( )$ denotes the divergence operator. Other gain functions may be employed within the scope of the present invention.

Substituting the control law of Eqn. 2 into Eqn. 3 (107) yields the feedback particle filter (FPF):

$$dX_t^i = a(X_t^i)dt + \sigma_B dB_t^i + \sum_{m=1}^{M} K^m(X_t^i, t) dI_t^{i,m} + \frac{1}{2}(\sigma_W^m)^2 (\nabla K^m(X_{t,}^i t)) K^m(X_t^i, t) dt. \quad (9)$$

An optimization framework is presented in detail in Yang et al. (ACC, 2011) and in Yang et al. (CDC, 2011). While the synthesis of the control input has been cast as an optimization in terms of the Kullback-Leibler metric as the cost function, it is to be understood that the use of other metrics falls within the scope of the present invention.

The solution, above, yields the required estimate of the stochastic variable (109), while Yang et al. (CDC, 2011) show that, in the infinite-population limit (as N→∞), the empirical distribution of particles converges to the true posterior distribution of $X_t$ given $\mathcal{Z}^t$.

As depicted in FIG. 2, use of a feedback particle filter (FPF), in conjunction with an innovation process as suggested for the first time in accordance with the present invention, advantageously provides for a generalization of the Kalman filter (KF) to a general class of nonlinear problems. FPF inherits many of the properties that has made the KF so widely applicable over the past five decades:

Innovation process. The innovation error-based feedback structure is a key feature of the feed-back particle filter (9). The innovation error is now based on the average value of the prediction $h(X_t^i)$ of the $i^{th}$-particle and the prediction $\hat{h}_t$ due to the entire population.

Feedback structure. The feedback particle filter has a feedback structure similar to the Kalman filter: At each time t, the FPF is obtained by using a proportional gain feedback with respect to the innovations error. The filter design amounts to design of the proportional gain—the solution is given by the Kalman gain in the linear case.

Sampling is not required. Whereas conventional particle filters require re-sampling, embodiments of the present invention require no such re-sampling. This property allows the FPF to be flexible with regards to implementation and does not suffer from sampling-related issues.

Several salient improvements may advantageously be achieved through practice of methods in accordance with embodiments of the present invention:

Variance reduction. Feedback can help reduce the high variance that is sometimes observed in the conventional particle filter. Numerical results support this claim—See FIG. 3 for a comparison of the FPF, in accordance with an embodiment of the present invention, and a prior art bootstrap particle filter (BPF) for the linear filtering problem.

Filter stability. The variance issue can be especially severe if the signal process (1a) is unstable. In this case, individual particles can exhibit numerical instabilities due to time-discretization, floating point representation etc. These issues may be advantageously avoided with the feedback particle filter applied in accordance with embodiments of the present invention.

Adaptation and learning. There are many approaches in nonlinear and adaptive control to both approximate feedback control laws as well as learn/adapt these in online fashion. For feedback particle filter, the feedback control formulation suggests applicability of adaptive control methods to deal with uncertain or time-varying sensor and dynamic models.

Synchronization with multiple models. One approach to account for parameter uncertainty is to introduce it in the initial selection of particle models. In controlled settings, feedback can cause the particles to synchronize, thereby automatically achieving a consensus on the correct model. This feature may be useful for instance in filtering of signal models with uncertain parameters (e.g., drag coefficient in ballistic objects) and also for maneuvering targets with multiple models.

Hardware implementation. Since the FPF avoids sampling, it is cost-effective to implement on a dedicated hardware platform. The filter is implemented as repeated circuits (particles) whose interaction (coupling) is decided according to the innovations error based feedback structure.

Approximation of the Gain Function

Implementation of the feedback particle filter requires solution of some BVP (the Euler-Lagrange, in the embodiment described above) to obtain the gain function K(x, t) for each fixed t. A variety of algorithms have been developed to evaluate the gain function, either via numerical solution of the BVP or using one of a variety of analytical formulae to approximate the gain function, and all are within the scope of the present invention. By their nature, efficient algorithms for evaluation of gain function are somewhat application-dependent, and all are within the scope of the present invention.

In accordance with particular embodiments of the present invention, a Galerkin finite-element algorithm, as now described, may be employed to obtain an approximate numerical solution of the boundary value problem of Eqn. 8. The gain function K is approximated as $$K(x, t) = \sum_{l=1}^{L} \kappa_l(t) \nabla \psi_l(x), \quad (10)$$

where $\{\psi_l(x)\}_{l=1}^{L}$ are basis functions that have been selected in an a priori fashion (e.g., as Fourier or polynomial functions). At each time t, a Galerkin procedure is used to solve for the unknown constants $\{K_l(t)\}_{l=1}^{L}$. Denoting $K=(K_1, K_2, \ldots, K_L)$, the solution is obtained by solving a linear matrix equation:

$$AK=-b. \quad (11)$$

The entries of the matrix A and the vector b are obtained by using the particles:

$$[A]_{kl} = \frac{1}{N} \sum_{i=1}^{N} \nabla \psi_l(X_t^i) \cdot \nabla \psi_k(X_t^i),$$

$$b_k = \frac{1}{N} \sum_{i=1}^{N} \left[ h(X_t^i) - \frac{1}{N} \sum_{j=1}^{N} h(X_t^j) \psi_k(X_t^j) \right].$$

An important point to note with respect to the foregoing is that the gain function K(x, t) is computed in terms of certain averages taken over the population.

Constant Gain Approximation

In one approximation that may be employed within the scope of the present invention, the basis functions are the coordinate functions $\psi_k(x)=x_k$ for k=1, 2, ..., d. The gain function may then be obtained as, $$\kappa(t) = \frac{1}{N} \sum_{i=1}^{N} (h(X_t^i) - \hat{h}_t) X_t^i. \quad (12)$$

The formula of Eqn. 12 may be referred to as the constant-gain approximation of the gain function.

Extensions of the Feedback Particle Filter

A basic feedback particle filter as has been described with reference to any of the foregoing embodiments may be extended to any manner of filtering problems with data association uncertainty. Filtering with data association uncertainty is important to a number of applications, including, air and missile defense systems, air traffic surveillance, weather surveillance, ground mapping, geophysical surveys, remote sensing, autonomous navigation and robotics. For example, consider the problem of tracking multiple targets with radar. The targets can be multiple aircrafts in air defense, multiple ballistic objects in missile defense, multiple weather cells in weather surveillance, or multiple landmarks in autonomous navigation and robotics. In each of these applications, there exists data association uncertainty in the sense that one can not assign individual measurements to individual targets in an apriori manner.

Similar issues also arise in autonomous navigation and robotics, e.g., in the so-called simultaneous localization and mapping (SLAM) problem. The objective of the SLAM problem is to use online sensor measurements (from a remote sensor, such as radar, LIDAR, or an optical camera, all cited by way of example) on a moving vehicle (or a robot) to simultaneously i) estimate the 'map' (landmarks or features in the external environment) and ii) localize the vehicle (or the robot) with respect to the map. A solution of the SLAM problem requires a joint solution of the two coupled problems:

1. The data association problem to assign individual measurements to landmarks in the map, and
2. The filtering problem to estimate the landmark and vehicle locations.

In accordance with alternate embodiments of the present invention, the feedback particle filtering framework provides for an integrated approach to the data association and filtering problems. Methods in accordance with such aspects of the present invention may be referred to herein as "the joint probabilistic data association-feedback particle filter" (JPDA-FPF). One salient feature of the JPDA-FPF is its innovation error-based feedback structure. The innovation error-based feedback structure may be advantageous in particular applications by virtue of the coupled nature of the filtering and the data association problems.

Joint Probabilistic Data Association-Feedback Particle Filter

Extensions of the basic feedback particle filter, as described above, in the presence of probabilistic data association, are now laid out in detail. Additional details may be found in Yang et al. (ACC, 2012). The problem is to estimate the hidden signal (target location) whose evolution is described by a SDE:

$$dX_t = a(X_t)dt + \sigma_B dB_t, \quad (13)$$

where one obtains M measurements at time t, at most one of which originates from the target. Other signals may be originating from other sources. For example, one may be receiving radar returns, and only some fraction of them are being received from an intended target. Mathematically, this may be modeled by introducing an association random variable $A_t \in \{0, 1, \ldots, M\}$. The association random variable is used to associate one measurement to the target: $A_t = m$ signifies that the $m^{th}$-measurement $Z_t^m$ originates from the target, and $A_t = 0$ means that the intended target was not detected at all at time t.

Mathematically, at time t, the observation model is then given by, $$dZ_t^m = 1_{[A_t = m]} h(X_t) dt + \sigma_W dW_t^m, \quad (14)$$

for $m \in \{1, \ldots, M\}$, where $\{W_t^m\}$ are mutually independent standard Wiener processes and $$1_{[A_t = m]} := \begin{cases} 1 & \text{when } A_t = m \\ 0 & \text{otherwise.} \end{cases}$$

The objective, then, of certain embodiments of the invention, is that of obtaining the posterior distribution of $X_t$ given the history of observations (filtration) $\mathcal{Z}^t := \sigma(Z_s : s \leq t)$, which is to say, extracting an estimate of the trajectory of the intended target from among various measurements that were made.

In accordance with embodiments of the present invention, methods are provided that may be divided, for heuristic convenience, into two parts:
1. evaluation of an "association probability;" and
2. integration of the association probability in the feedback particle filter framework.

The association probability is defined as the probability of the association $[A_t = m]$ conditioned on $\mathcal{Z}^t$:

$$\beta_t^m := P([A_t = m] | \mathcal{Z}^t), m = 0, 1, \ldots M. \quad (15)$$

In simple terms, that means that the association probability represents the probability that a given observation is, in fact, associated with a specified target, given the history of observations. Since the events are mutually exclusive and exhaustive, $\Sigma_{m=0}^M \beta_t^m = 1$. A filter for estimating the association probability is obtained as now described, and as further detailed in Yang et al. (ACC, 2012).

As in the case of the feedback particle filter described above and as laid out in Eqn. 3, the probabilistic data association-feedback particle filter is a controlled system:

$$dX_t^i = a(X_t^i)dt + \sigma_B dB_t^i + dU_t^i, \quad (16)$$

where the control now is of the following form:

$$dU_t^i := \sum_{m=1}^M \beta_t^m K(X_t^i, t) dI_t^{i,m} + \frac{1}{2}(\beta_t^m)^2 (\sigma_W)^2 (\nabla K(X_t^i, t)) K(X_t^i, t) dt, \quad (17)$$

where $I_t^{i,m}$ is a modified form of the innovation process, an example of which appears above as Eqn. 4. In particular, an innovation process is now given by:

$$dI_t^{i,m} := dZ_t^m - \left(\frac{\beta_t^m}{2} h(X_t^i) + \left(1 - \frac{\beta_t^m}{2}\right) \frac{1}{N} \sum_{j=1}^N h(X_t^j)\right) dt, \quad (18)$$

where the gain function K is a solution of the boundary value problem, as before:

$$\nabla \cdot (pK) = -\frac{1}{\sigma_W^2}\left(h - \frac{1}{N}\sum_{j=1}^N h(X_t^j)\right)p. \quad (19)$$

For extreme values of $\beta_t^m$, the filter reduces to readily recognizable forms:
1. If $\beta_t^m = 1$, the measurement is associated with the target with probability 1. In this case, the filter is just the standard feedback particle filter.
2. If $\beta_t^m = 1, \ldots, M$, the measurement carries no information and the control input $dU_t^i = 0$ For $\beta_t^m \in (0, 1)$, the control is more nuanced. While the innovation error-based feedback control structure is preserved, the association probability serves to modify the formulae for the gain function and the innovation error, as follows:
1. The gain function is effectively reduced to $\beta_t^m K(X_t^i, t)$. That is, the control gets less aggressive in the presence of data association uncertainty.
2. The innovation error is given by a more general formula, Eqn. 12. The optimal prediction of the $i^{th}$-particle is now a weighted average of $h(X_t^i)$ and the population prediction $$\frac{1}{N}\sum_{j=1}^N h(X_t^j).$$

Effectively, then, in the presence of data association uncertainty, a particle gives more weight to the population in computing its innovation error.

The present invention may be embodied in any number of instrument modalities. In alternative embodiments, the disclosed methods for using feedback particle filtering to estimate a conditional probability distribution may be implemented as a computer program product for use with a computer system. Such implementations may include a series of computer instructions fixed, in a non-transitory way, either on a tangible medium, such as a computer readable medium (e.g., a diskette, CD-ROM, ROM, or fixed disk) or transmittable to a computer system, via a modem or other interface device, such as a communications adapter connected to a network over a medium. The medium may be either a tangible medium (e.g., optical or analog communications lines) or a medium implemented with wireless techniques (e.g., microwave, infrared or other transmission techniques). The series of computer instructions embodies all or part of the functionality previously described herein with respect to the system. Those skilled in the art should appreciate that such computer instructions can be written in a number of programming languages for use with many computer architectures or operating systems. Furthermore, such instructions may be stored in any memory device, such as semiconductor, magnetic, optical or other memory devices, and may be transmitted using any communications technology, such as optical, infrared, microwave, or other transmission technologies. It is expected that such a computer program product may be distributed as a removable medium with accompanying printed or electronic documentation (e.g., shrink wrapped software), preloaded with a computer system (e.g., on system ROM or fixed disk), or distributed from a server or electronic bulletin board over the network (e.g., the Internet or World Wide Web). Of course, some embodiments of the invention may be implemented as a combination of both software (e.g., a computer program product) and hardware. Still other embodiments of the invention are implemented as entirely hardware, or entirely software (e.g., a computer program product).These and other variations and modifications are within the scope of the present invention as defined in any appended claims.

We claim:

1. A method for estimating a conditional probability distribution for signal states of a non-linear random dynamic process associated with a plurality of moving vehicles, the method comprising:
   a. tracking the plurality of moving vehicles by receiving sensor measurement data, the sensor measurement data providing a history of observations;
   b. initializing a state for each of a plurality of particles, the plurality of particles together comprising an entire population of particles, the states of the plurality of particles collectively probabilistically representing an estimate of a state of the non-linear random dynamic process at an initial time; and
   c. updating the state of each of the plurality of particles to obtain a posterior distribution defining a trajectory of each of the plurality of moving vehicles based on a control input derived by proportional gain feedback on an innovation process, wherein the innovation process is the difference between an observed quantity based on sensor data at time t and a quantity in which a function of a particle state is a term.

2. A method in accordance with claim 1, further comprising acquiring the sensor measurement data from at least one sensor.

3. A method in accordance with claim 2, wherein the at least one sensor is a remote sensor.

4. A method in accordance with claim 2, wherein the at least one sensor is a camera.

5. A method in accordance with claim 1, wherein the control input is a solution to an optimization problem.

6. A method in accordance with claim 1, wherein the step of updating includes application of proportional feedback based on a gain function.

7. A method in accordance with claim 6, wherein the gain function is derived by numerical solution of a boundary value problem.

8. A method in accordance with claim 6, wherein the gain function is derived by numerical solution of an Euler-Lagrange boundary value problem.

9. A method in accordance with claim 6, wherein the gain function is obtained by analytical approximation.

10. A method in accordance with claim 6, wherein the gain function is obtained by a Galerkin finite-element algorithm.

11. A method in accordance with claim 1, wherein the innovation process comprises, in particular, at least a term proportional to an average of predictions due to the entire population of particles.

12. A method in accordance with claim 1, wherein the sensor measurement data correspond to a plurality of positions of each of the plurality of moving vehicles at least one moving object relative to a fixed frame of reference.

13. A method in accordance with claim 12, wherein the at least one plurality of moving vehicles are object is a ballistic objects.

14. A method in accordance with claim 12, wherein none of the at least one plurality of moving vehicles object is a ballistic object.

* * * * *

UNITED STATES PATENT AND TRADEMARK OFFICE
CERTIFICATE OF CORRECTION

PATENT NO. : 9,077,314 B2  
APPLICATION NO. : 13/670596  
DATED : July 7, 2015  
INVENTOR(S) : Prashant G. Mehta, Tao Yang and Sean P. Meyn Page 1 of 1

It is certified that error appears in the above-identified patent and that said Letters Patent is hereby corrected as shown below:

In the claims,

In column 12, lines 37 and 38  
Delete "at least one moving object"

In column 12, lines 39 and 40  
Delete "at least one"

In column 12, line 40  
Delete "object is a"

In column 12, line 43  
Delete "at least one"

In column 12, line 43  
Delete "object"

Signed and Sealed this  
Twenty-second Day of December, 2015

Michelle K. Lee  
*Director of the United States Patent and Trademark Office*